(12) United States Patent
Orii et al.

(10) Patent No.: US 6,513,537 B1
(45) Date of Patent: Feb. 4, 2003

(54) SUBSTRATE PROCESSING METHOD AND SUBSTRATE PROCESSING APPARATUS

(75) Inventors: Takehiko Orii, Nirasaki (JP); Hiroki Ohno, Tokyo-To (JP); Takashi Yabuta, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/702,679

(22) Filed: Nov. 1, 2000

(30) Foreign Application Priority Data

Nov. 1, 1999 (JP) .......................................... 11-310735

(51) Int. Cl.$^7$ .......................... B08B 6/00; H01L 21/302

(52) U.S. Cl. .................... 134/1.2; 134/1.3; 438/725; 438/720; 438/734; 216/57; 216/91

(58) Field of Search .................. 134/1.2, 1.3; 438/725, 438/720, 734, 750; 216/57, 91; 156/345

(56) References Cited

U.S. PATENT DOCUMENTS

| 3,677,848 A | * | 7/1972 | Stoller et al. .................. 156/17 |
| 6,209,551 B1 | * | 4/2001 | Yang et al. .................. 134/1.2 |
| 6,235,641 B1 | * | 5/2001 | Christenson ................ 438/706 |

FOREIGN PATENT DOCUMENTS

| EP | 782177 | * | 7/1997 |
| JP | 07-142438 | * | 6/1995 |
| JP | 08-181137 | * | 7/1996 |

* cited by examiner

*Primary Examiner*—George Goudreau
(74) *Attorney, Agent, or Firm*—Smith, Gambrell & Russell, LLP

(57) ABSTRACT

The present invention relates to a method of removing a polymer veil and a metal contamination deposited on a substrate having a metal layer. First, the polymer veils are removed by a chemical liquid in an inert gas atmosphere. Subsequently, the metal contamination are removed by oxidizing the metal contamination into metal oxide contamination by mixing oxygen in a small concentration in the inert gas atmosphere, and dissolving the metal oxide contamination by the chemical liquid.

11 Claims, 11 Drawing Sheets

SUBSTRATE PROCESSING METHOD AND SUBSTRATE PROCESSING APPARATUS

BACKGROUND OF THE INVENTION

1. Field of the Invention

The present invention relates to a technique for removing metal contamination deposited on a substrate in a process for fabricating a semiconductor device or the like by using a processing liquid.

2. Description of the Related Art

In recent years, Cu wiring layers have become used instead of Al wiring layers in semiconductor devices fabricating processes to deal with the progressive miniaturization of design rules.

When forming Cu wiring layers in a multilayer structure, a lower Cu wiring layer is formed on a semiconductor wafer, i.e., a substrate, an SiN barrier film and a layer insulating film are formed in that order over the lower Cu wiring layer, a photoresist film is formed over the layer insulating film, the photoresist film is patterned by photolithography to form a resist mask of a desired pattern, and the layer insulating film and the SiN barrier film are etched by dry etching using the resist mask to form contact holes reaching to the lower Cu wiring layer. Then, the resist mask is removed by dry ashing, the residual portions of the resist mask and etch residue remaining in the contact holes, such as fragments of a polymer, are removed by cleaning using a cleaning liquid, such as a hydrofluoric acid solution (HF solution), sulfuric acid solution ($H_2SO_4$ solution) or an organic peeling agent, and then a Cu film is deposited over the layer insulating film to form an upper Cu wiring layer on the layer insulating film and to fill up the connecting holes with Cu.

Polymer veils are formed on the side surfaces of the contact holes, respectively, when etching the layer insulating film by dry etching using a plasma produced by ionizing an etching gas. Therefore, the polymer veils remain in the contact holes. When the layer insulating film is etched through such that the lower Cu wiring layer is exposed, Cu is caused to sputter and sputtered Cu particles deposit on the polymer veils. The sputtered Cu particles deposited on the polymer veils must be removed together with the polymer veils.

The semiconductor device fabricating process uses Cu as a plating metal and Cu particles are deposited on the back surface of the semiconductor wafer during plating. Such Cu particles must be removed from the back surface of the semiconductor wafer. The cleaning liquid may be used for removing the Cu particles.

However, the Cu particles cannot be removed by treating the semiconductor wafer simply with the cleaning liquid; first of all, the Cu particles must be oxidized into CuO particles because Cu is insoluble in the cleaning liquid and CuO is soluble in the cleaning liquid.

Although the Cu particles may be oxidized in air, and then the oxidized Cu particles may be removed by a treatment using a chemical liquid, the Cu wiring layer and the plated Cu layer will be dissolved and removed and the Cu layers will be damaged.

SUMMARY OF THE INVENTION

It is an object of the present invention to provide a method capable of removing at least two kinds of deposits (e.g., polymer veil and metal contamination) deposited on a substrate without damaging a necessary metal deposit (e.g., metal layer for wiring) formed on the same substrate. More specifically, it is an object of the present invention to provide a substrate processing method and a substrate processing apparatus capable of removing unnecessary metal contamination deposited on a substrate without damaging a necessary metal deposit formed on the same substrate.

According to a first aspect of the present invention, a method of removing a metal contamination deposited on a substrate having a metal layer is provided. The method includes the steps of: creating an inert gas atmosphere around the substrate; supplying oxygen into the inert gas atmosphere to create an atmosphere of the inert gas and oxygen; and supplying a processing liquid onto the substrate disposed in the atmosphere of the inert gas and oxygen; wherein the metal contamination deposited on the substrate is oxidized by the oxygen contained in the atmosphere into metal oxide contamination, and the metal oxide contamination is dissolved and removed with the processing liquid.

The present invention also provides a method of removing a metal contamination deposited on a substrate having a metal layer. The method includes the steps of: creating an inert gas atmosphere around the substrate; supplying a processing liquid onto the substrate disposed in the atmosphere, the processing liquid including an oxygen; wherein the metal contamination deposited on the substrate is oxidized by the oxygen contained in the processing liquid into metal oxide contamination, and the metal oxide contamination is dissolved and removed with the processing liquid.

The present invention also provides a method of removing polymer veil and metal contamination deposited on a substrate having a metal layer with a processing liquid. The method includes the steps of: placing the substrate in a processing space; creating an inert gas atmosphere in the processing space and supplying the processing liquid onto the substrate, thereby dissolving and removing the polymer veil; and creating an atmosphere of the inert gas and oxygen in the processing space and supplying a processing liquid onto the substrate, thereby dissolving and removing the metal contamination oxidized by the oxygen.

The present invention also provides a method of removing a polymer veil remaining on a substrate after forming at least a metal layer on the substrate and an insulating layer over the metal layer and an etching portion of the insulating layer through the insulating layer so as to reach to the metal layer, and a metal contamination included in the polymer veil when the metal layer is sputtered by etching. The method includes the steps of: (a) placing the etched substrate in a processing space; (b) creating an inert gas atmosphere in the processing space and supplying a processing liquid onto the substrate, thereby dissolving and removing the polymer veil to expose the metal contamination, (c) creating an atmosphere containing an inert gas and oxygen in the processing space and supplying the processing liquid onto the substrate after the step (b), thereby dissolving and removing the exposed metal contamination oxidized by the oxygen; and (d) creating an inert gas atmosphere again in the processing space, and supplying the processing liquid onto the substrate after the step (c), thereby dissolving and removing a residual of the polymer veil remaining on the substrate.

The present invention also provides a method of removing a resist mask, a polymer veil and a metal contamination existing on a substrate, the substrate having a metal layer and an insulating layer arranged on the metal layer, the insulating layer being etched while using the resist mask so that the etched portion thereof reaches to the metal layer, the resist mask, the polymer veil and a metal contamination remaining on the substrate after the insulating layer being etched, the metal contamination being included in the polymer veil. The method includes the steps of: (a) placing the etched substrate in a processing space; (b) supplying an inert gas into the processing space to create an inert gas atmosphere in the processing space and supplying a processing liquid onto the substrate, thereby dissolving and removing the resist mask; (c) supplying a processing liquid onto the substrate placed in the processing space of the inert gas atmosphere, thereby dissolving and removing the polymer so that the metal contamination included in the polymer veil is exposed; (d) introducing an oxygen-containing gas into the processing space after the step (b) and (c) to create an atmosphere containing oxygen in the processing space and supplying a processing liquid onto the substrate, thereby dissolving and removing the metal contamination oxidized by the oxygen; and(e) stopping introducing the oxygen-containing gas to create an inert gas atmosphere again in the processing space and supplying a processing liquid onto the substrate after the step (d), thereby dissolving and removing a residual of the polymer veil.

The present invention also provides a method of removing at least two kinds of deposits deposited on a substrate, said method comprising the steps of: placing the substrate in a processing space; creating a first atmosphere of a first oxygen concentration in the processing space; dissolving and removing a first kind of deposit of at least the two kinds of deposits by supplying the processing liquid onto the substrate in the processing space of the first atmosphere; creating a second atmosphere of a second oxygen concentration different from the first oxygen concentration in the processing space; and dissolving and removing a second kind of deposit of at least the two kinds of deposits by supplying a processing liquid onto the substrate in the processing space of the second atmosphere.

According to the second aspect of the present invention, a substrate processing apparatus that removes metal contamination deposited on a substrate provided with a metal layer is provided. The apparatus includes: a processing vessel defining a processing space in which the substrate is placed; a first gas supply pipe for supplying an inert gas into the processing space; an second gas supplying pipe for supplying a gas including oxygen gas into the processing space; a gas discharging pipe for discharging an atmosphere in the processing space; a processing liquid supplying pipe for supplying a processing liquid into the processing space, the processing liquid being capable of removing the metal contamination deposited on the substrate; and a draining pipe for draining the processing liquid used in the processing space.

DESCRIPTION OF THE PREFERRED EMBODIMENTS

First Embodiment

Figure 1:
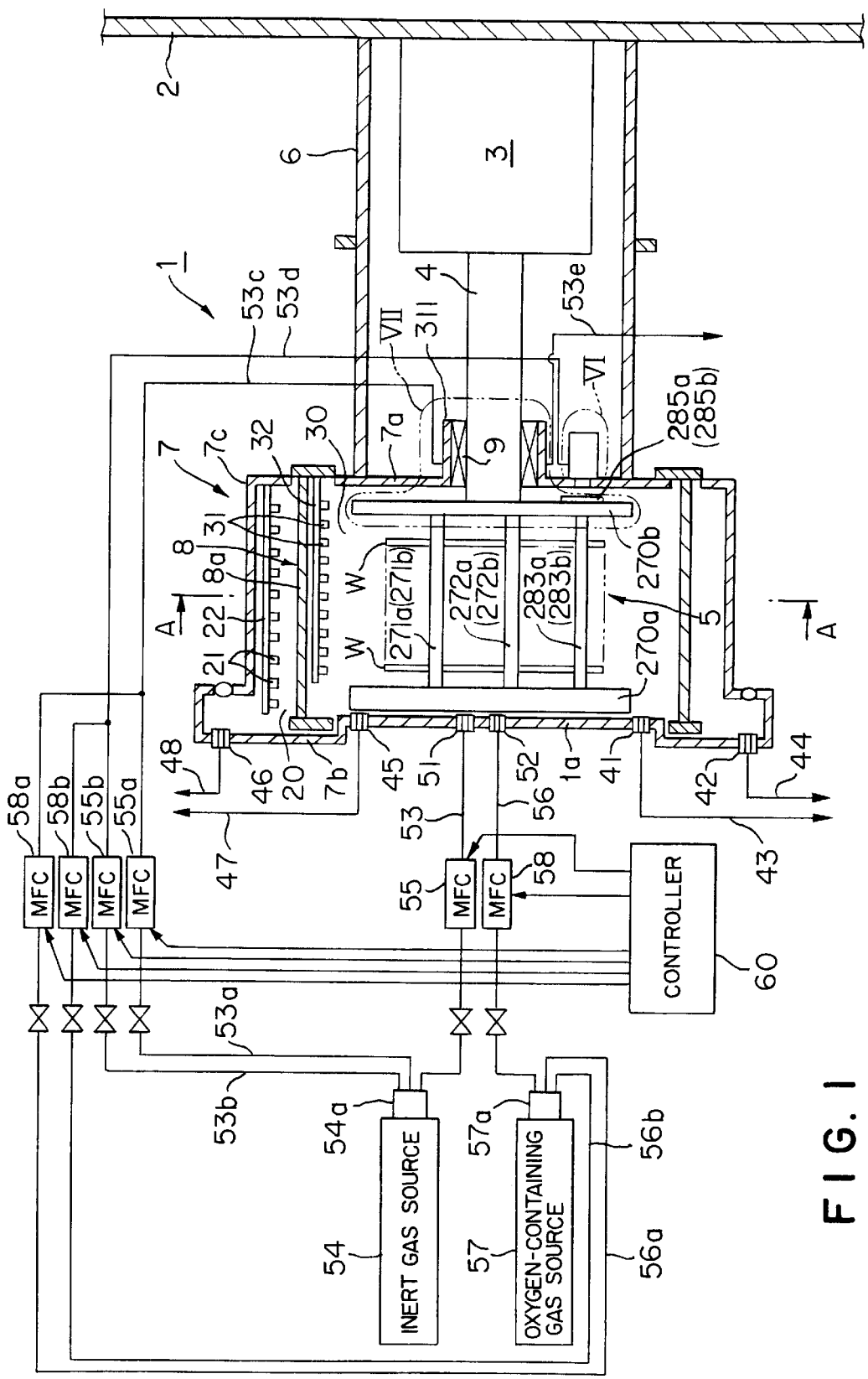
FIG. 1 is a schematic sectional view of a substrate processing apparatus in a preferred embodiment according to the present invention provided with an outer cylinder and an inner cylinder, in which the inner cylinder is disposed inside the outer cylinder.

A substrate processing apparatus 1 shown in FIG. 1 removes a resist mask, polymer layers, i.e., etch residues, and metal contamination produced by sputtering from a semiconductor wafer (hereinafter referred to simply as "wafer") W after an etching process.

The substrate processing apparatus 1 has a motor 3 fixed to a vertical support wall 2 with its rotor shat 4 extended in a horizontal position. A rotor 5 is mounted on the driving shaft 4 of the motor 3. A cylindrical cover 6 is attached to the support wall 2 so as to surround the motor 3 and the driving shaft 4.

The rotor 5 is capable of holding a plurality of wafers W, for example, twenty-five wafers W, horizontally arranged in a vertical position. Rotor 5 holding the plurality of wafers W is rotated when the motor 3 is driven.

A vertical end wall 7a is fixed to one end of the cover 6. The gap between the vertical end plate 7a and the driving shaft 4 is sealed by fluid sealing members 9. A vertical end wall 7b is disposed opposite to the vertical end wall 7a. An outer cylinder 7c is disposed so as to surround the rotor 5. The outer cylinder 7c is axially movable. The outer cylinder 7c is positioned as shown in FIG. 1 during a process, and is retracted toward the cover 6 when loading wafers W on and unloading the same from the rotor 5.

An inner cylinder 8a of a diameter smaller than that of the outer cylinder 7c is disposed so as to surround the rotor 5. The inner cylinder 8a can be horizontally moved between a working position shown in FIG. 1 and a retracted position shown in FIG. 2. As shown in FIG. 1, a processing space 30 is defined by the inner cylinder 8a and the vertical end walls 7a and 7b when the inner cylinder 8a is placed at the working position inside the outer cylinder 7c. A processing space 20 is defined by the outer cylinder 7c and the vertical end walls 7a and 7b when the inner cylinder 8a is placed at the retracted position as shown in FIG. 2. The processing spaces 20 and 30 are sealed by sealing mechanisms.

Figure 3:
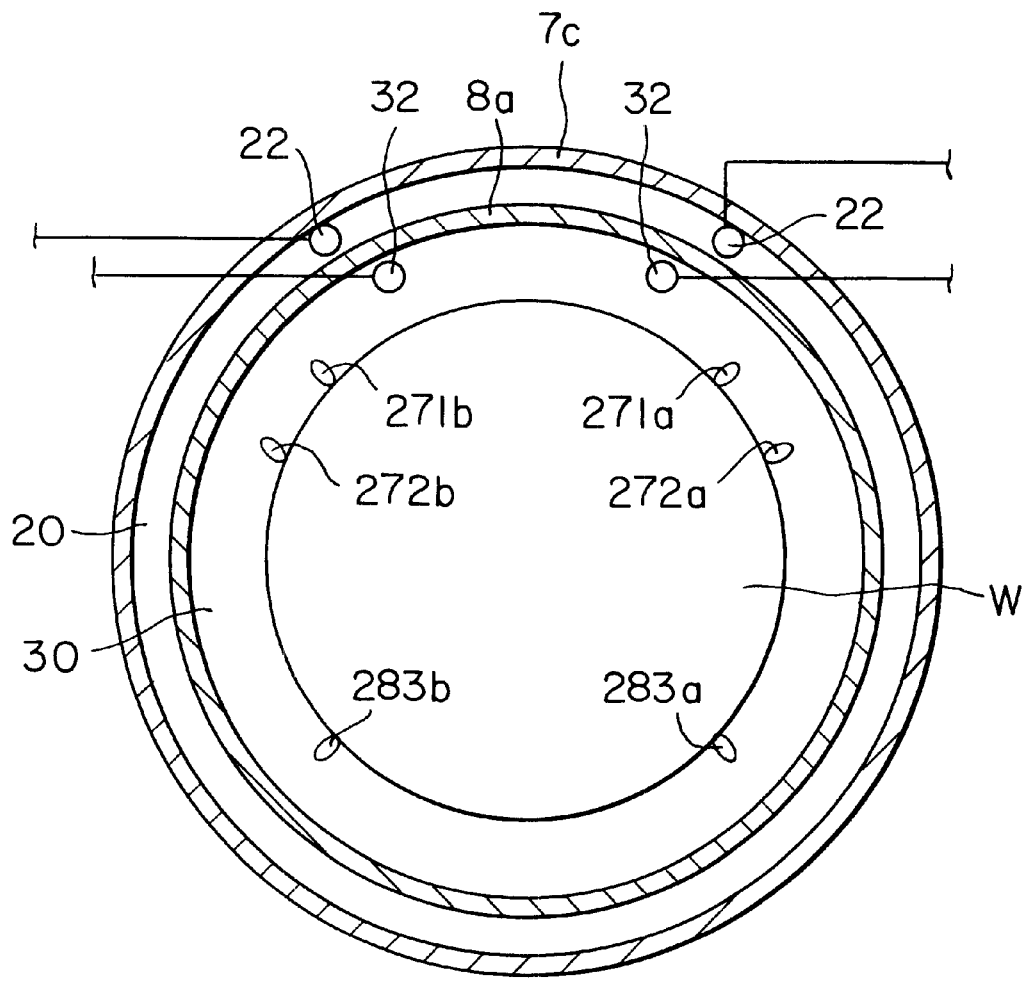
FIG. 3 is a sectional view taken on line A—A in FIG. 1.

Two discharge pipes 22 each provided with a plurality of nozzles 21 are disposed horizontally in an upper region of the processing space 20 as shown in FIG. 3. Desired one of pure water, IPA (isopropyl alcohol), $N_2$ gas and various chemical liquids supplied from sources, not shown, can be discharged through the nozzles 21 of the discharge pipes 22.

Two discharge pipes 32 each provided with a plurality of nozzles 31 are disposed horizontally in an upper region of the processing space 30 and are held on the inner cylinder 8a. Desired one of pure water, IPA, $N_2$ gas and various chemical liquids supplied from sources, not shown, can be discharged through the nozzles 31 of the discharge pipes 32.

The chemical liquids, i.e., processing liquids, discharged through the discharge pipes 22 and 32 are capable of dissolving resists, polymer veils and metal contamination. Those chemical liquids include, for example, a hydrofluoric acid solution (HF solution), a sulfuric acid solution ($H_2SO_4$ solution) and an organic peeling agent.

Figure 2:
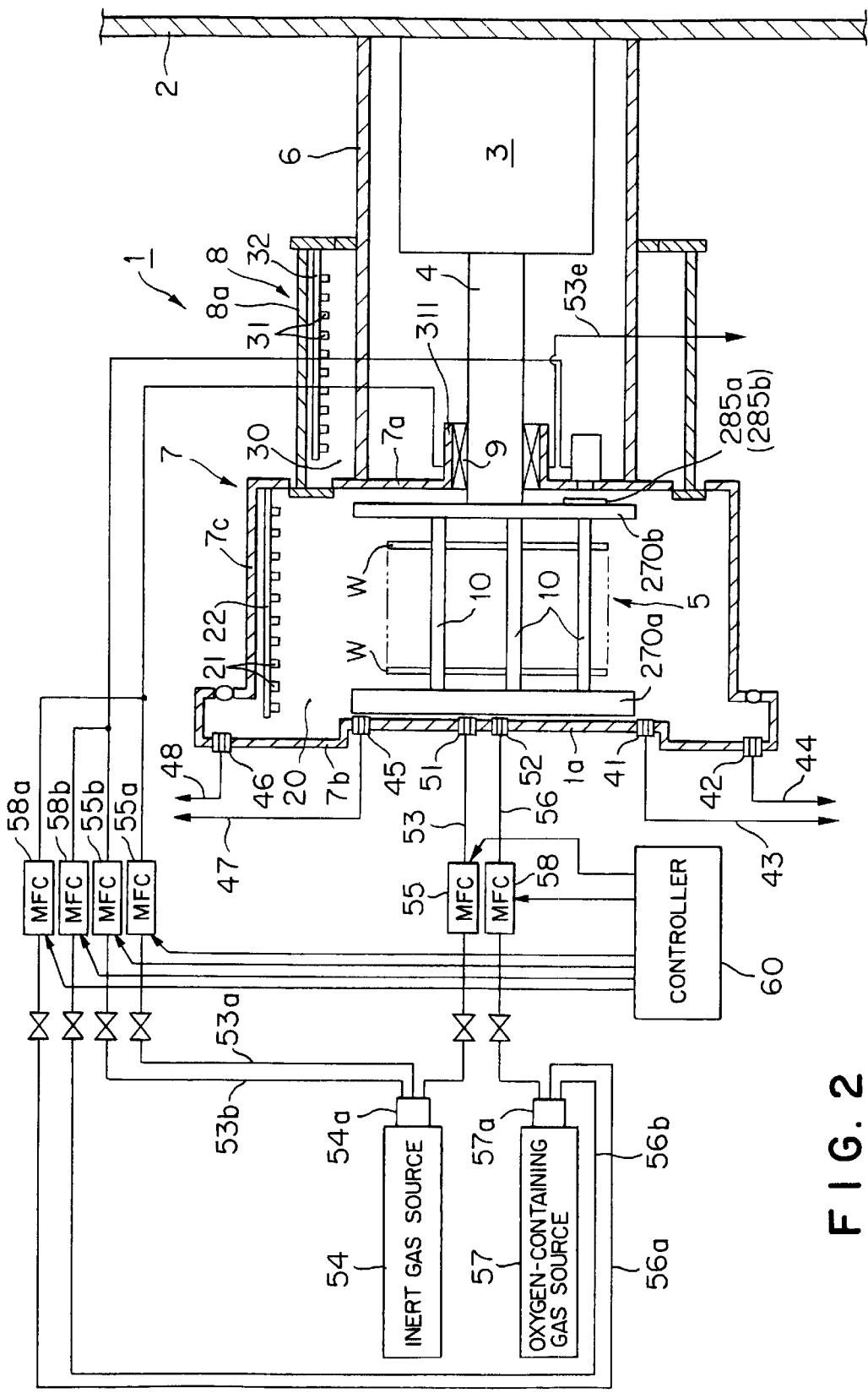
FIG. 2 is a schematic sectional view of the substrate processing apparatus shown in FIG. 1, in which the inner cylinder is disposed outside the outer cylinder.

A first drain port 41 is formed in a lower portion of the vertical end wall 7b to drain a used chemical liquid, i.e., a chemical liquid that has reacted with a workpiece, used pure water or used IPA from the processing space 30 in a state shown in FIG. 1. A second drain port 42 is formed below the first drain port 41 in the vertical end wall 7b to drain a used chemical liquid, used pure water or used IPA from the processing space 20 in a state shown in FIG. 2. A first drain pipe 43 and a second drain pipe 44 are connected to the first drain port 41 and the second drain port 42, respectively.

A first exhaust port 45 is formed in an upper portion of the vertical end wall 7b to exhaust the processing space 30 in the state shown in FIG. 1. A second exhaust port 46 is formed above the first exhaust port 45 in the vertical end wall 7b to exhaust the processing space 20 in the state shown in FIG. 2. A first exhaust pipe 47 and a second exhaust pipe 48 are connected to the first exhaust port 45 and the second exhaust port 46, respectively.

An inert gas supply port 51 for supplying an inert gas, such as $N_2$ gas or Ar gas, into the processing space 30 and an oxygen-containing gas supply port 52 for supplying an oxygen-containing gas, such as oxygen gas ($O_2$ gas), air or ozone gas ($O_3$ gas), into the processing space 30 are formed in a central portion of the vertical end wall 7b. An inert gas source 54 is connected to the inert gas supply port 51 by an inert gas supply pipe 53 to supply an inert gas into the processing space 30. An oxygen-containing gas source 57 is connected to the oxygen-containing gas supply port 52 by a pipe 56 to supply an oxygen-containing gas, usually, air, into the processing space 30. Heaters 54a and 57a are combined with the inert gas source 54 and the oxygen-containing gas source 57 to heat the inert gas and the oxygen-containing gas, respectively. The dissolving effect of the chemical liquid can be enhanced by raising the temperature of the atmosphere in the processing space 30 by the heated inert gas or the heated oxygen-containing gas supplied into the processing space 30. Mass-flow controllers 55 and 58 are placed in the inert gas supply pipe 53 and the oxygen-containing gas supply pipe 56 to control the respective flow rates of the inert gas and oxygen-containing gas, respectively. Thus, the condition of the atmosphere in the processing space 30 can be regulated.

Pipes 56a and 56b respectively provided with mass-flow controllers 58a and 58b are connected to the oxygen-containing gas source 57. Pipes 53a and 53b respectively provided with mass-flow controllers 55a and 55b are connected to the inert gas source 54. The pipes 53a and 56a are connected to a pipe 53c. The pipes 53b and 56b are connected to a pipe 53d. The pipe 53c is connected to a boss 301 near a switching member 292a (292b), which will be described later in connection with FIG. 6. The pipe 53d is connected to a cylindrical member 310 near fluid sealing members 9, which will be described later in connection with FIG. 7.

The condition of the mass-flow controllers 55, 55a, 55b, 58, 58a and 58b is controlled by a controller 60. Flowmeters may be used instead of the mass-flow controllers and the respective flow rates of the gases flowing through the corresponding pipes may be manually adjusted.

Figure 4:
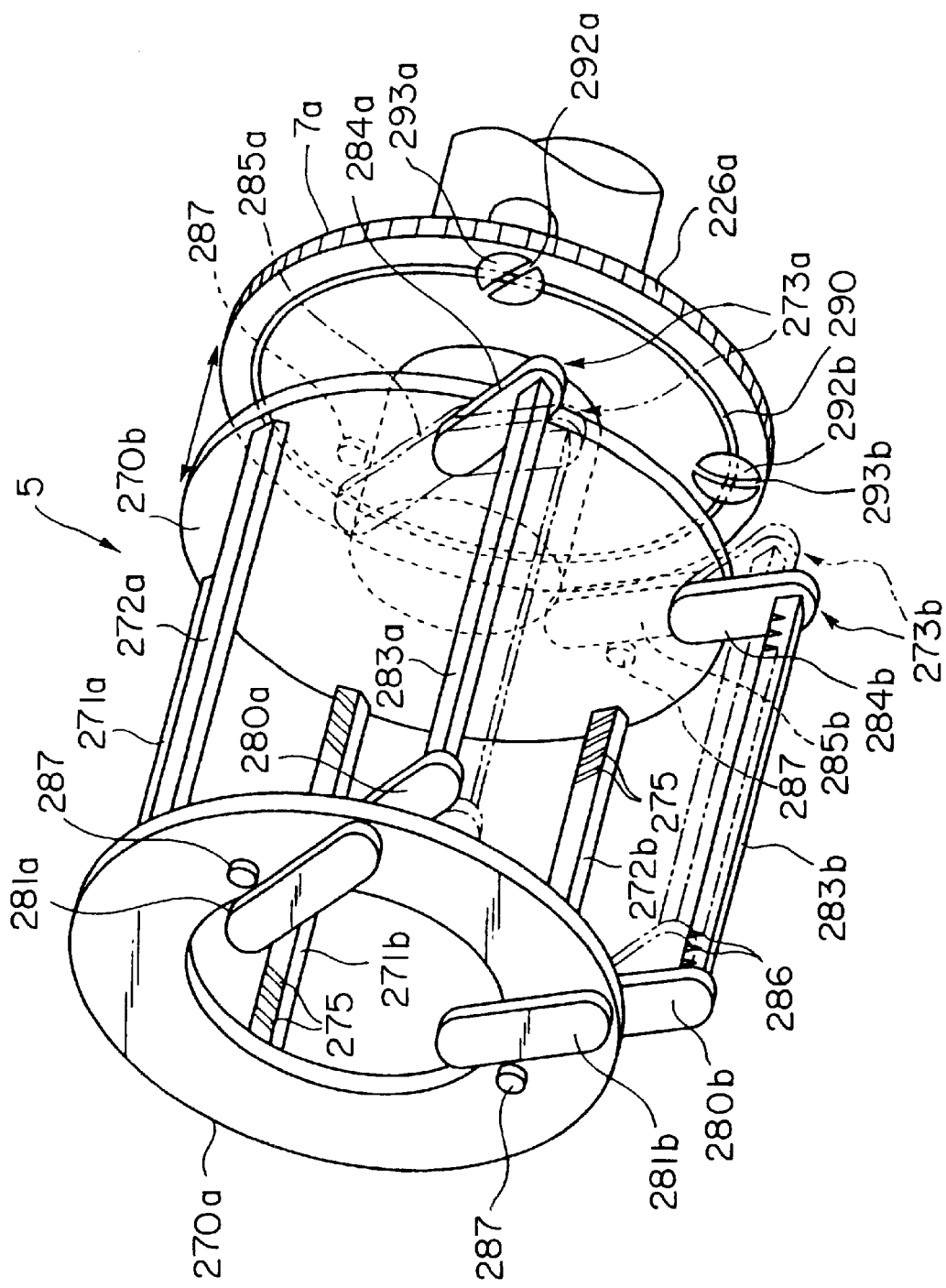
FIG. 4 is a perspective view of a rotor included in the substrate processing apparatus shown in FIG. 1.
Figure 5:
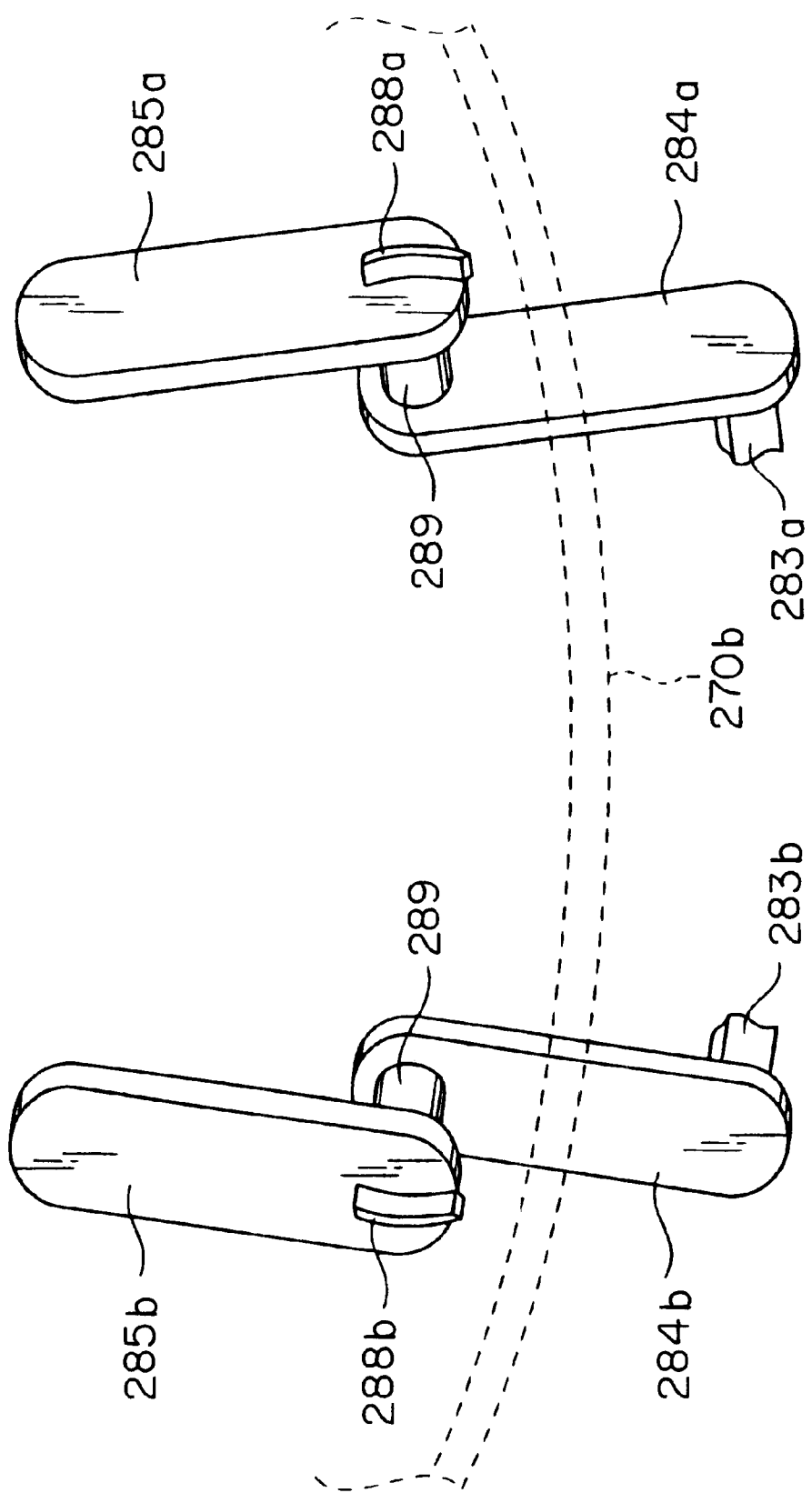
FIG. 5 is a perspective view of a rotor holding mechanism.

The construction of the rotor 5 will be described with reference to FIGS. 4 and 5. The rotor 5 is capable of holding, for example, twenty-six wafers W in a vertical position in a horizontal arrangement. As shown in FIG. 4, the rotor 5 has a pair of disks 270a and 270b, first holding members 271a and 271b extended between the pair of disks 270a and 270b, second holding members 272a and 272b extended between the pair of disks 270a and 270b, and a pair of holding mechanisms 273a and 273b for fixedly holding wafers W on the rotor 5.

The first holding members 271a and 271b and the second holding members 272a and 272b are provided with a plurality of grooves 275 for receiving peripheral portions of wafers W therein, respectively. At least one of the holding members 271a, 271b, 272a and 272b is provided with a pressure sensor.

The holding mechanism 273a includes an arm 280a disposed on the inner side of the disk 270a, a balance weight 281a disposed on the outer side of the disk 270a, an arm 284a disposed on the inner side of the disk 270b, a balance weight 285a disposed on the outer side of the disk 270a, and a third holding member 283a extended between the arms 280a and 204a. The arm 280a and the balance weight 281a are fixedly connected to the opposite ends, respectively, of a shaft 289 penetrating the disk 270a for simultaneous turning. The arm 284a and the balance weight 285a are fixedly connected to the opposite ends, respectively, of a shaft 289 penetrating the disk 270b for simultaneous turning. The holding mechanism 273b is similar in construction to the holding mechanism 273a. The holding mechanism 273b includes an arm 280b disposed on the inner side of the disk 270a, a balance weight 281b disposed on the outer side of the disk 270a, an arm 284b disposed on the inner side of the disk 270b, a balance weight 285b disposed on the outer side of the disk 270b and a third holding member 283b extended between the arms 280b and 284b. The arm 280b and the balance weight 281b are fixedly connected to the opposite ends, respectively, of a shaft 289 penetrating the disk 70a for simultaneous turning. The arm 284b and the balance weight 285b are fixedly connected to the opposite ends, respectively, of a shaft 289 penetrating the disk 270b for simultaneous turning. The third holding members 283a and 283b of the holding mechanisms 273a and 273b are provided with a plurality of grooves 286 for receiving peripheral portions of wafers W therein. Stopping pins 287 project from the outer surfaces of the disks 270a and 270b. When the third holding members 283a and 283b of the holding mechanisms 273a and 273b are turned toward wafer holding positions, respectively, the outward turning of the balance weights 281a, 281b, 285a and 285b is limited by the stopping pins 287 to prevent the balance weights 281a, 281b, 285a and 285b from turning excessively outward and from touching the wall surrounding the rotor 5. As shown in FIG. 5, the balance weights 285a and 285b supported on the disk 270b adjacent to the vertical end wall 7a are provided with curved projections 288a and 288b, respectively.

An annular guide groove 290 is formed in the inner surface of the vertical end wall 7a. Circular openings 291a and 291b are formed in the vertical end wall 7a at positions on the guide groove 290 and respectively corresponding to the holding mechanisms 273a and 273b. Selecting members 292a and 292b are fitted in the circular openings 291a and 291b so as to be turnable in the directions of the arrows θ. Curved slots 293a and 293b having the shape of an arc of a circle corresponding to the annular guide groove 290 are formed in the front surfaces of the selecting members 292a and 292b, respectively. The selecting members 292a and 292b can be set in either an angular position in which the curved slots 293a and 293b form portions of the guide groove 290 (see broken lines in FIG. 4) or an angular position in which the curved slots 293a and 293b extend across the guide groove 290 (see solid lines in FIG. 4). The curved projections 2888a and 288b of the balance weights 285a and 285b can be fitted in the curved slots 293a and 293b, respectively. The state of the holding mechanisms 273a and 273b can be selectively determined by the angular positions of the selecting members 292a and 292b.

When the selecting members 292a and 292b are set so that the curved slots 293a and 293b extend across the guide groove 290 to set the balance weights 285a and 285b in a vertical position, the holding mechanisms 273a and 273b are set in a wafer releasing state.

When the selecting members 292a and 292b are set so that the curved slots 293a and 293b are continuous with the guide groove 290 and the balance weights 285a and 285b diverge upward, the holding mechanisms 273a and 273b are set in a wafer holding state. In this state, the curved projections 288a and 288b of the balance weights 285a and 285b are able to move along the guide groove 290 and the curved slots 293a and 293b continuous with the guide groove 290, so that the rotor 5 is allowed to rotate. Since the condition of the holding mechanisms 273a and 273b remains unchanged regardless of the angular position of the rotor 5, the wafer W are not released when the rotor 5 is rotated. Therefore, it is possible to prevent the projection of the wafers W from the rotor 5 and the resultant obstruction of the supply of a cleaning liquid or a drying gas by the projecting wafers W and the breakage of the projecting wafers W.

Figure 6:
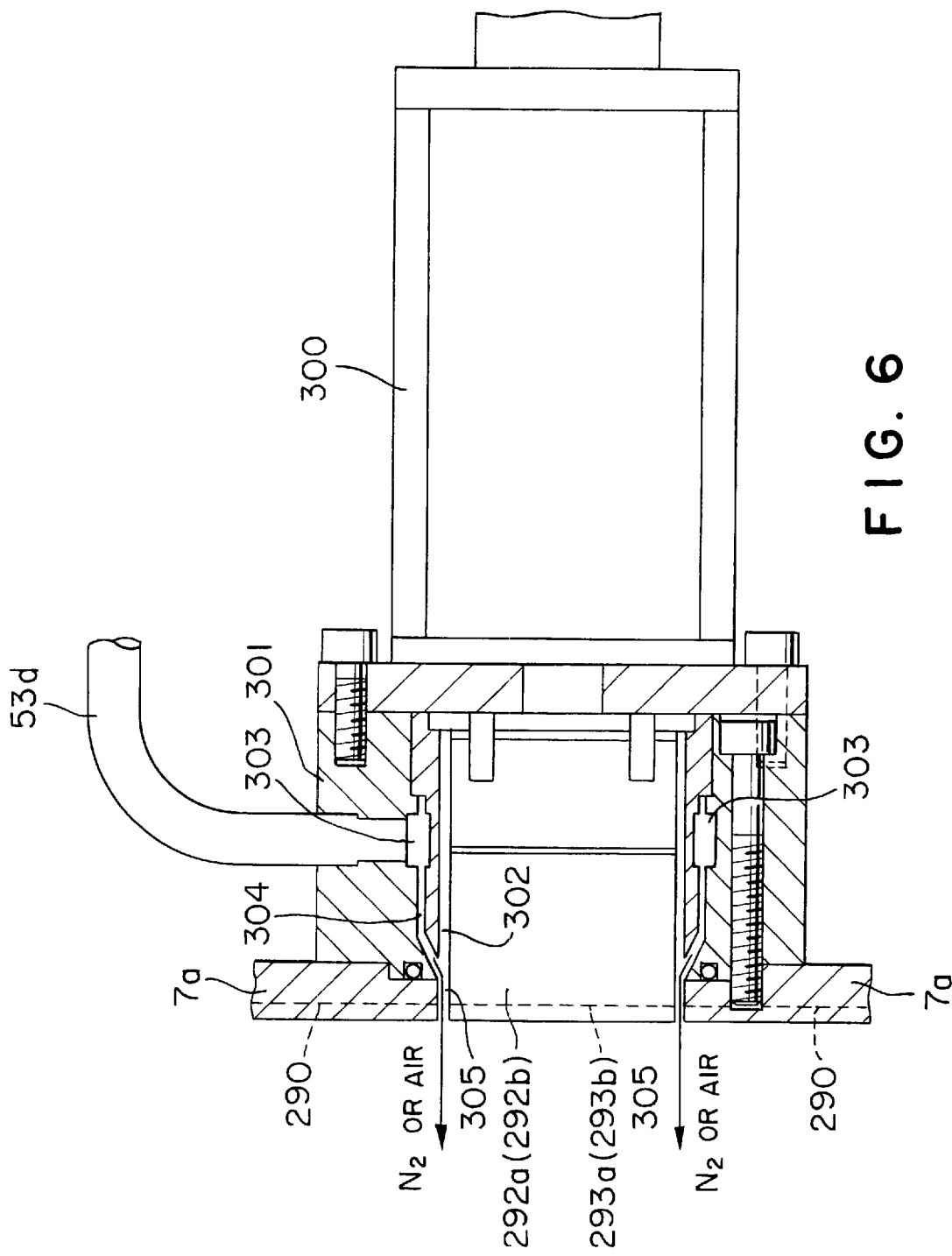
FIG. 6 is a sectional view of a region VI in FIG. 1.

A detailed structure around the selecting member 292a (292b) will be described with reference to FIG. 6 showing a region VI schematically shown in FIG. 1.

The selecting member 292a is driven for rotation by a rotary cylinder 300 connected thereto. The rotary cylinder 300 is fixed to a ring body 301 fastened to the vertical end wall 7a. The selecting member 292a is fitted in the through hole of the ring body 301 with a clearance 302. An annular groove 303 is formed in the ring body 301. A gas supply pipe 53d is connected to the annular groove 303. An axial annular passage 304 of a small thickness is connected to the annular groove 303. The annular passage 304 into a gap 305 between the selecting member 292a and the vertical end wall 7a. An inert gas (or an oxygen-containing gas) supplied through the gas supply pipe 53d into the annular groove 303 flows through the gap 305 into the processing space. The inert gas (or the oxygen-containing gas) is thus supplied through the gap 305 into the processing space for the auxiliary adjustment of the atmosphere in the processing space and for the prevention of the stay of a processing liquid in the gap 305 between the selecting member 292a that turns and the vertical end wall 7a. If the processing liquid stays and dries up in the gap 305, particles are produced and wafers are contaminated with the particles. Since the processing liquid is unable to stay in the gap 305 such a problem will not arise.

Figure 7:
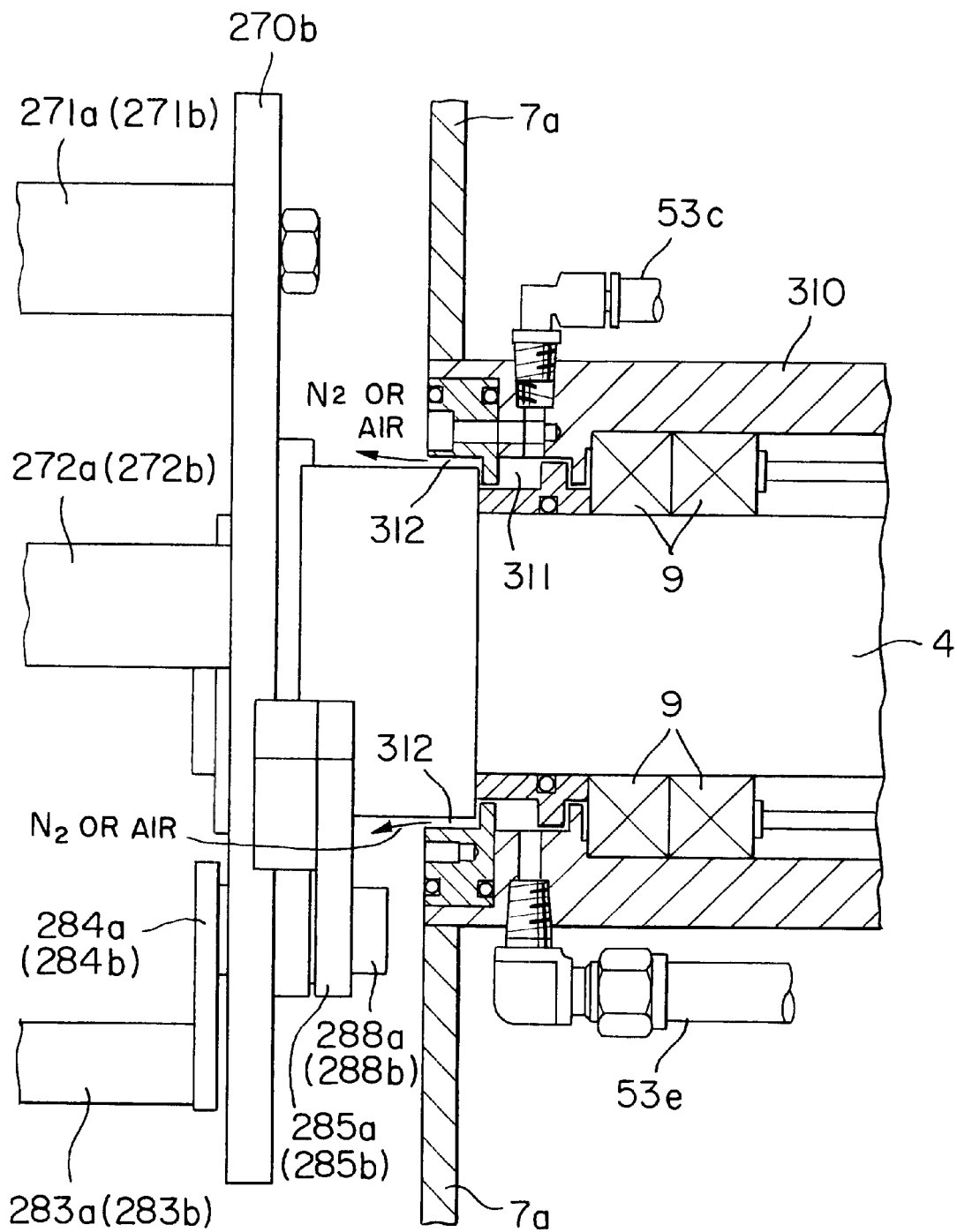
FIG. 7 is a sectional view of a region VII in FIG. 1.

A detailed structure around the fluid sealing members 9 will be described with reference to FIG. 7 showing a region VII schematically shown in FIG. 1.

A tubular member 310 is connected to the vertical end wall 7a so as to surround the driving shaft 4. The fluid sealing members 9 are packed in an annular space between the tubular member 310 and the driving shaft 4. An annular passage 311 is formed between the tubular member 310 and the driving shaft 4. A gas supply pipe 53c and a gas discharge pipe 53e are connected to the annular passage 311 at diametrically opposite positions, respectively. The annular passage 311 communicates with the processing space by means of a gap 312 between the tubular member 310 and the driving shaft 4. An inert gas (or an oxygen-containing gas) supplied through the gas supply pipe 53c into the annular passage 311 flows through the gap 312 into the processing space. The inert gas (or the oxygen-containing gas) is thus supplied through the gap 312 into the processing space for the auxiliary adjustment of the atmosphere in the processing space and for the prevention of the stay of a processing liquid in the gap 312 around the driving shaft 4 that rotates.

Figure 8:
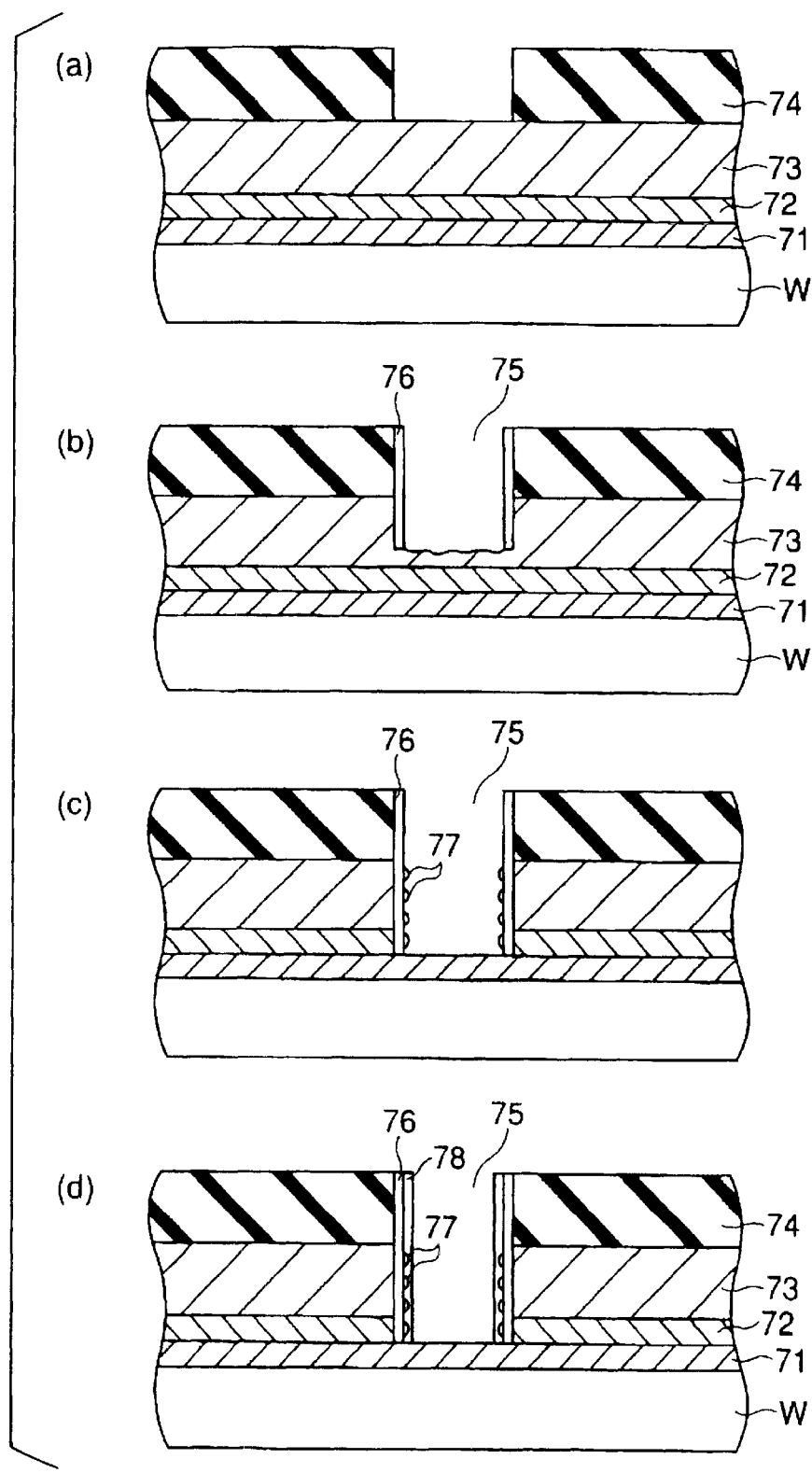
FIG. 8 is sectional view of a workpiece in different phases of a semiconductor device fabricating process.

Description will be given of operations of the substrate processing apparatus 1 for processing semiconductor devices, i.e., wafers W, processed by an etching process shown in FIG. 8.

First, the etching process shown in FIG. 8 will be described. As shown in FIG. 8(a), a Cu wiring layer 71, a SiN barrier film 72 and a layer insulating film 73 are formed in that order on a wafer W, such as a silicon wafer. A photoresist film 74 is formed over the layer insulating film 73. The photoresist film 74 is patterned in a resist mask having a predetermined wiring pattern by photolithography. The layer insulting layer 73 may be a $SiO_2$ film or the so-called low-k film, i.e., a film of an organic material having a small dielectric constant which is used prevalently in recent years for the enhancement of the data processing speed of semiconductor devices.

As shown in FIG. 8(b), the layer insulating film 73 is etched by a plasma etching process using the resist mask and a plasma of an etching gas to form contact holes 75 in the layer insulating film 73. A component of the etching gas is deposited as a first polymer veil 76 on the side wall of each of the contact holes 75. The first polymer veils 76 serve as protective layers for highly anisotropic etching.

As the plasma etching process proceeds, the surface of the Cu wiring layer 71 is exposed in each contact hole 75 as shown in FIG. 8(c). Part of the Cu wiring layer 71 is sputtered and Cu particles 77 deposits on the first polymer veils 76 of the contact holes 75. The plasma etching process is continued for overetching after portions of the surface of the Cu wiring layer 71 have been exposed. Consequently, a second polymer veil 78 is formed on the side wall of each contact hole 75, and the Cu particles are included in the second polymer veils 78.

The substrate processing apparatus 1 carries out a process to process wafers W similar to that shown in FIG. 8(d). The process removes the resist mask (resist layer 74), the polymer veils 76 and 78, and the Cu particles (metal contamination) from the wafers W. The outer cylinder 7c and the inner cylinder 8a are retracted to their retracted positions over the cylindrical cover 6, a plurality of wafers W are delivered from below the rotor 5 to the rotor 5, the wafers W are held on the rotor 5 by the holding members 271a, 271b, 272a, 272b, 283a and 283b. The outer cylinder 7c and the inner cylinder 8a are placed at their working positions around the rotor 5 to define a sealed processing space 30 as shown in FIG. 1.

Then, an inert gas, such as $N_2$ gas, is supplied from the inert gas source 54 through the inert gas supply pipe 53 and the inert gas supply port 51 into the processing space 30. The inert gas also supplied into the processing space via the pipes 53c, 53d. On the other hand, the atmosphere in the processing space 30 is discharged through the first exhaust port 45. Consequently, the processing space 30 is purged and an inert gas atmosphere is created in the processing space 30. The inert gas is supplied continuously into the processing space 30 and the atmosphere in the processing space 30 is discharged continuously during the following dissolving and removing processes.

Then, the rotor 5 holding the wafers W is rotated at a low rotating speed, a predetermined chemical liquid (processing liquid) is discharged through the nozzles 31 of the discharge pipes 32 into the processing space 30 to dissolve and remove the resist masks and the polymer veils 76 and 78. More specifically, the predetermined chemical liquid is discharged through the nozzles 31 of the discharge pipes 32 for several tens seconds while the rotor 5 holding the wafers W is rotated at a low rotating speed in the range of 1 to 500 rpm to wet the surfaces of the wafers W uniformly with the chemical liquid.

The rotating speed of the rotor 5 is determined taking into consideration the viscosity of the chemical liquid in order that the surfaces of the wafers W are wetted uniformly with the chemical liquid and the resist masks and the polymer veils 76 and 78 are dissolved evenly. The rotor 5 is rotated at a comparatively high rotating speed in the foregoing range when the chemical liquid has a high viscosity or at a comparatively low rotating speed in the foregoing range when the chemical liquid has a low viscosity.

After the resist masks and the polymer veils 76 and 78 have been dissolved, the used chemical liquid stays on the surfaces of the wafers W. Since the dissolving ability of the used chemical liquid is low, the used chemical liquid staying on the wafers W must be removed. The supply of the chemical liquid is stopped temporarily, hot $N_2$ gas is discharged through the nozzles 31 of the discharge pipes 32 for several seconds and the rotor 5 is rotated at a rotating speed in the range of about 100 to about 3000 rpm higher than the rotating speed at which the rotor 5 is rotated during the dissolving process. Consequently, the used chemical liquid staying on the surfaces of the wafers W is removed by the pressure exerted on the used chemical liquid by the hot $N_2$ gas and centrifugal force that acts on the used chemical liquid when the rotor 5 is rotated. The rotating speed of the rotor 5 for effectively removing the used chemical liquid is determined according to the viscosity of the chemical liquid.

After the surfaces of the wafers W have been cleared of the used chemical liquid, the rotating speed of the rotor 5 is reduced to the operating rotating speed in the range of about 1 to about 500 rpm and a new chemical liquid is discharged through the nozzles 31 of the discharge pipes 32. A chemical liquid discharging step and a used chemical liquid removing step are repeated alternately a plurality of times in the range of several times to several thousands times to remove the resist mask and the polymer veils efficiently by supplying the highly reactive new chemical liquid always onto the surfaces of the wafers W.

Figure 9:
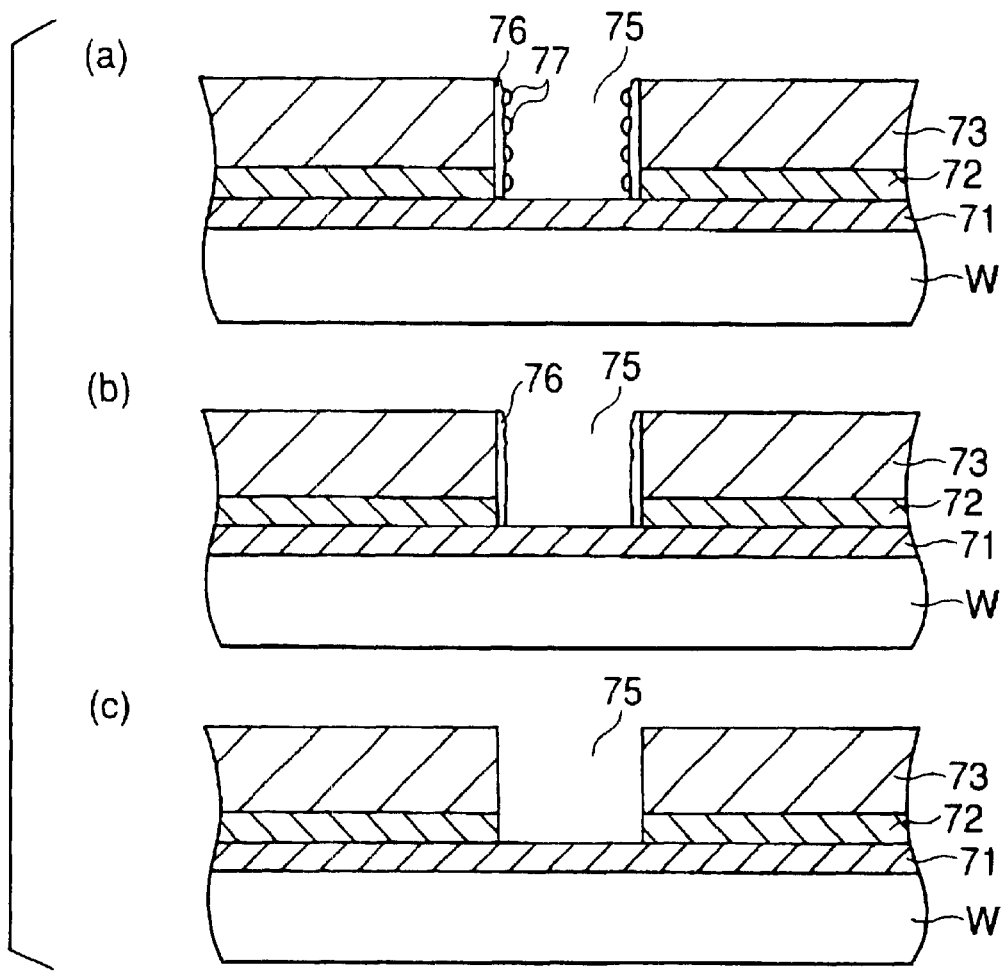
FIG. 9 is a sectional view of a workpiece of assistance in explaining a procedure for removing metal contamination and polymer veils.

Thus, the resist mask formed by patterning the resist layer 74 and the polymer veils 78 are removed and the polymer veils 76 are removed partly. The Cu particles 77 are not oxidized and hence are not removed because the inert gas prevails in the processing space 30. Consequently, the Cu particles 77 remains on the polymer veils 76 as shown in FIG. 9(a). When a chemical liquid, such as a hydrofluoric acid solution, a sulfuric acid solution or an organic peeling agent, is used, the Cu particles 77 cannot be dissolved. Although the oxidation of the Cu wiring layer 71 is suppressed in the inert gas atmosphere, the Cu particles 77 cannot be removed because only CuO is soluble in the chemical liquid.

This embodiment continues supplying the inert gas from the inert gas source 54 after the resist mask and the polymer veils 78 have been removed and an oxygen-containing gas, such as air, is supplied through the oxygen-containing gas supply port 52 into the processing space 30 to create an inert gas atmosphere containing oxygen in a small oxygen concentration. The controller 60 controls the mass-flow controllers 55, 55a, 55b, 58 58a and 58b to regulate the respective flow rates of the inert gas and the oxygen-containing gas so that the oxygen concentration of the atmosphere in the processing space 30 is regulated properly.

After properly adjusting the atmosphere in the processing space 30, the rotor 5 is rotated and a chemical liquid is discharged through the nozzles 31 of the discharge pipes 32 in a mode similar to that in removing the resist mask and the polymer veils 78. Oxygen contained in the atmosphere oxidizes the Cu particles 77 into CuO particles. The CuO particles are dissolved in the chemical liquid and are removed as shown in FIG. 9(b). In this embodiment, the chemical liquid for the resist mask and the polymer veil and a chemical liquid for the Cu particles are completely the same regarding their composition and concentration. However, these liquids may be substantially the same ones, in other words, for example, the respective concentration may be slightly different each other, and one of these liquid may include an addition agent that the other one does not include.

Although the Cu particles can be oxidized in the air and can be dissolved in the chemical liquid, considerable part of the Cu wiring layer 71 will be dissolved in the chemical liquid and removed. Since this embodiment processes the Cu particles 77 in the inert gas atmosphere containing oxygen in a small oxygen concentration, the Cu particles 77 can be removed, limiting the dissolution and removal of the Cu wiring layer 71 to the least unavoidable extent. The oxygen concentration of the inert gas atmosphere is determined according to the condition of deposition of the Cu particles 77 so that damage in the Cu wiring layer 71 is limited to the least possible extent. Although dependent on the condition of deposition of the Cu particles 77, the oxygen concentration is, for example, about 5% or below. The oxygen concentration of the inert gas atmosphere in the processing space 30 is adjusted by adjusting the flow rate ratio between the oxygen-containing gas and the inert gas, by adjusting the oxygen concentration of the oxygen-containing gas or by properly alternately using an air source and an $O_2$ gas source.

The used chemical liquid in the step of removing the Cu particles 77, similarly to the used chemical liquid in the step of removing the resist mask and the polymer veils, stays on the surfaces of the wafers W. When a certain amount of the chemical liquid is accumulated on the surfaces of the wafers W, the supply of the chemical liquid is stopped temporarily, hot $N_2$ gas is discharged through the nozzles 31 of the discharge pipes 32 for several seconds and the rotor 5 is rotated at a rotating speed higher than that at which the rotor 5 is rotated for the dissolving stage to remove the chemical liquid staying on the surfaces of the wafers W. The rotating speed of the rotor 5 for removing the chemical liquid staying on the surfaces of the wafers W is determined according to the viscosity of the chemical liquid and is in the range of about 100 to about 3000 rpm. A chemical liquid discharging step and a used chemical liquid removing step are repeated alternately a plurality of times in the range of several times to several thousands times to remove the Cu particles 77 efficiently. The Cu particles 77 are exposed to oxygen contained in the atmosphere in the processing space 30 and are oxidized when the chemical liquid staying on the surfaces of the wafers W is removed and, consequently, Cu particle removing efficiency can be improved.

The supply of the oxygen-containing gas is stopped and an inert gas atmosphere substantially not containing oxygen is created in the processing space 30 after the Cu particles 77 have been removed. The polymer veils 76 still remaining on the side walls of the connecting holes 75 are removed as shown in FIG. 9(c) by alternately repeating the step of supplying the chemical liquid and the step of removing the used chemical liquid. Since those steps are carried out in the inert gas atmosphere, the Cu wiring layer 71 is neither oxidized nor dissolved.

After the steps for removing the resist mask, the polymer veils 76 and 78 and the Cu particles 77 have been thus completed, IPA or pure water is discharged through the nozzles 31 of the discharge pipes 32 to clear the wafers W of reaction products remaining on the wafers W.

Then, the inner cylinder 8a is moved out of the outer cylinder 7a to the retracted position around the cylindrical cover 6. In this state, the wafers W are held in the processing space 20 surrounded by the outer cylinder 7a. Pure water is discharged through the nozzles 21 of the discharge pipes 22 to rinse the wafers W, and then the rotor 5 is rotated at a high rotating speed for the spin-drying of the wafers W.

The conventional substrate processing method employs an etching process that does not sputter the Cu wiring layer because the removal of Cu particles produced by sputtering the Cu wiring layer inevitably entails the removal of the Cu wiring layer. In the state shown in FIG. 8(a), the conventional substrate processing method etches only the layer insulating film 73, removes the resist mask and the polymer, and then etches the SiN barrier film 72 by using radicals having energy smaller than that of ions so that the Cu wiring layer 71 may not be sputtered. However, the conventional substrate processing method is complicated and the SiN barrier film 72 is etched irregularly because etching using radicals is isotropic. The substrate processing method of the present invention is capable of removing the Cu particles without damaging the Cu wiring layer 71 and does not entail problems due to complicated steps and irregular etching.

Figure 10:
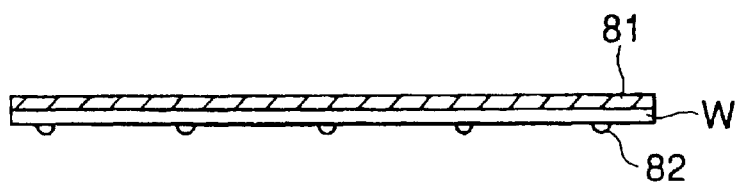
FIG. 10 is a sectional view of a semiconductor wafer to be processed by a substrate processing method in a second embodiment according to the present invention.

Although the substrate processing method has been described as applied to removing the Cu particles together with the polymer veils, the substrate processing method is applicable to the following semiconductor device fabrication. A semiconductor device fabricating method includes a plating process for plating a surface of a wafer W with Cu to form a Cu film 81 over the surface of the wafer W as shown in FIG. 10. Sometimes Cu deposits 82 are deposited on the back surface of the wafer W when plating the surface with Cu. In such a case, the Cu deposits 82 can be removed without damaging the plated Cu film 81 by creating an inert gas atmosphere containing oxygen in a predetermined oxygen concentration in the processing space 30 of the substrate processing apparatus shown in FIGS. 1 to 3 and carrying out the foregoing processing steps.

Modifications

The foregoing substrate processing method is subject to modification.
(1) The resist mask and the polymer veils may be removed in separate steps using different chemical liquids, respectively, instead of simultaneously removing the resist mask and the polymer veils. For example, when removing the resist mask and the polymer veils by a substrate processing method in a modification, a chemical liquid for removing the resist mask is supplied through the nozzles 31 of the discharge pipes 32 into the processing space 30 with the inner cylinder 8a disposed inside the outer cylinder 7c and a chemical liquid for removing the polymer veils is supplied through the nozzles 22 of the discharge pipes 21 into the processing space 20 after retracting the inner cylinder 8a.

(2) When both the polymer veils and the metal particles are deposited on the side walls of the connecting holes, it is not necessary to remove the polymer layers first: a step of dissolving and removing the metal particles may be carried out prior to a step of dissolving and removing the polymer veils.

(3) A polymer layer dissolving and removing step and a metal contamination dissolving and removing step may be alternately carried out as mentioned in (a) to (d) so that at least either of those steps is repeated a plurality of times. According to this modification (3), if the polymer layer and the metal contamination are complicatedly deposited, they can be removed completely.
(a) Polymer veil removal—metal contamination removal—polymer veil removal
(b) Metal contamination removal—polymer veil removal—metal contamination removal
(c) Repetition of a set of polymer veil removal—metal contamination removal at least twice
(d) Repetition of a set of metal contamination removal—polymer veil removal at least twice (4) Although the foregoing substrate processing method uses two kind of atmosphere, i.e., the inert gas atmosphere and the inert gas atmosphere containing oxygen in a predetermined oxygen concentration, alternately to carry out the step of removing the polymer veils and the step of removing the metal particles alternately, the polymer veils and the metal particles (contamination) may be removed by other methods as will be described below.

It is known from analytical studies made by the inventors of the present invention that some metal particles are Cu-rich and other metal particles are CuO-rich. The mode of deposition of metal particles is closely related with the condition of progress of an etching process. Therefore, it is possible that the properties of deposited metal particles vary with depth from the surface of a layer to be removed. For example, Cu-rich metal particles gather in surface regions of a layer and CuO-rich metal particles gather in inner regions of the layer.

Much oxygen is needed to perfectly oxidize Cu-rich metal particles and less oxygen is needed to oxidize CuO-rich metal particles. In view of preventing damaging the Cu wiring layer, it is preferable to use the inert gas atmosphere having the least necessary oxygen concentration. Therefore it is preferable to carry out the following dissolving and removing procedure.

Figure 11:
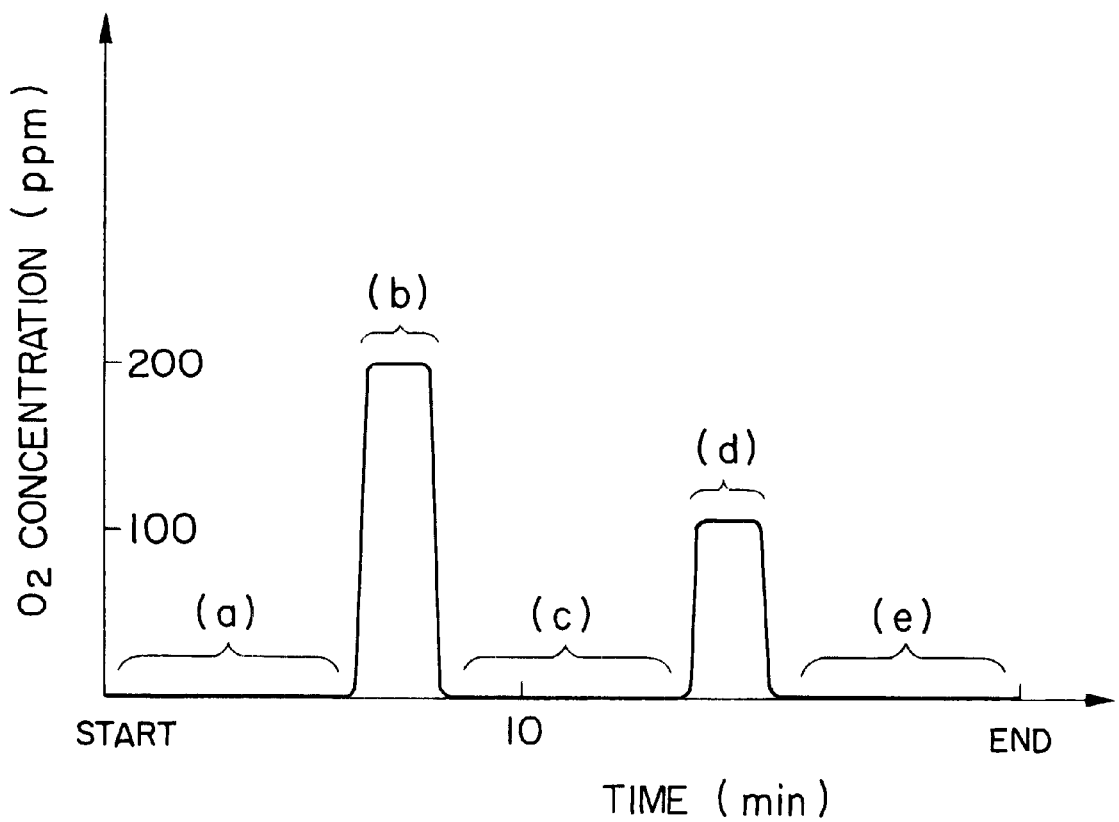
FIG. 11 is a graph of assistance in explaining another procedure for removing deposits.

FIG. 11 is a graph of assistance in explaining the dissolving and removing procedure, in which the oxygen concentration of the atmosphere in the processing space is measured upward on the vertical axis and time is measured to the right on the horizontal axis.
(a) The dissolving and removing process is continued for 3 min in an inert gas atmosphere ($N_2$ gas atmosphere) to dissolve and remove the polymer veils.
(b) The dissolving and removing process is continued for 1 min in an inert gas atmosphere containing oxygen in 200 ppm to remove the Cu-rich metal particles.
(c) The dissolving and removing process is continued for 3 min in an inert gas atmosphere to remove the polymer veils.
(d) The dissolving and removing process is continued for 1 min in an inert gas atmosphere containing oxygen in 100 ppm to dissolve and remove the Cu)-rich metal particles.
(e) The dissolving and removing process is continued for 3 min in an inert gas atmosphere to dissolve and remove the polymer veils.

Damage in the Cu wiring layer can be further reduced and the metal particles and the polymer veils can be removed by processing the wafer by this dissolving and removing procedure.

Second Embodiment

Figure 12:
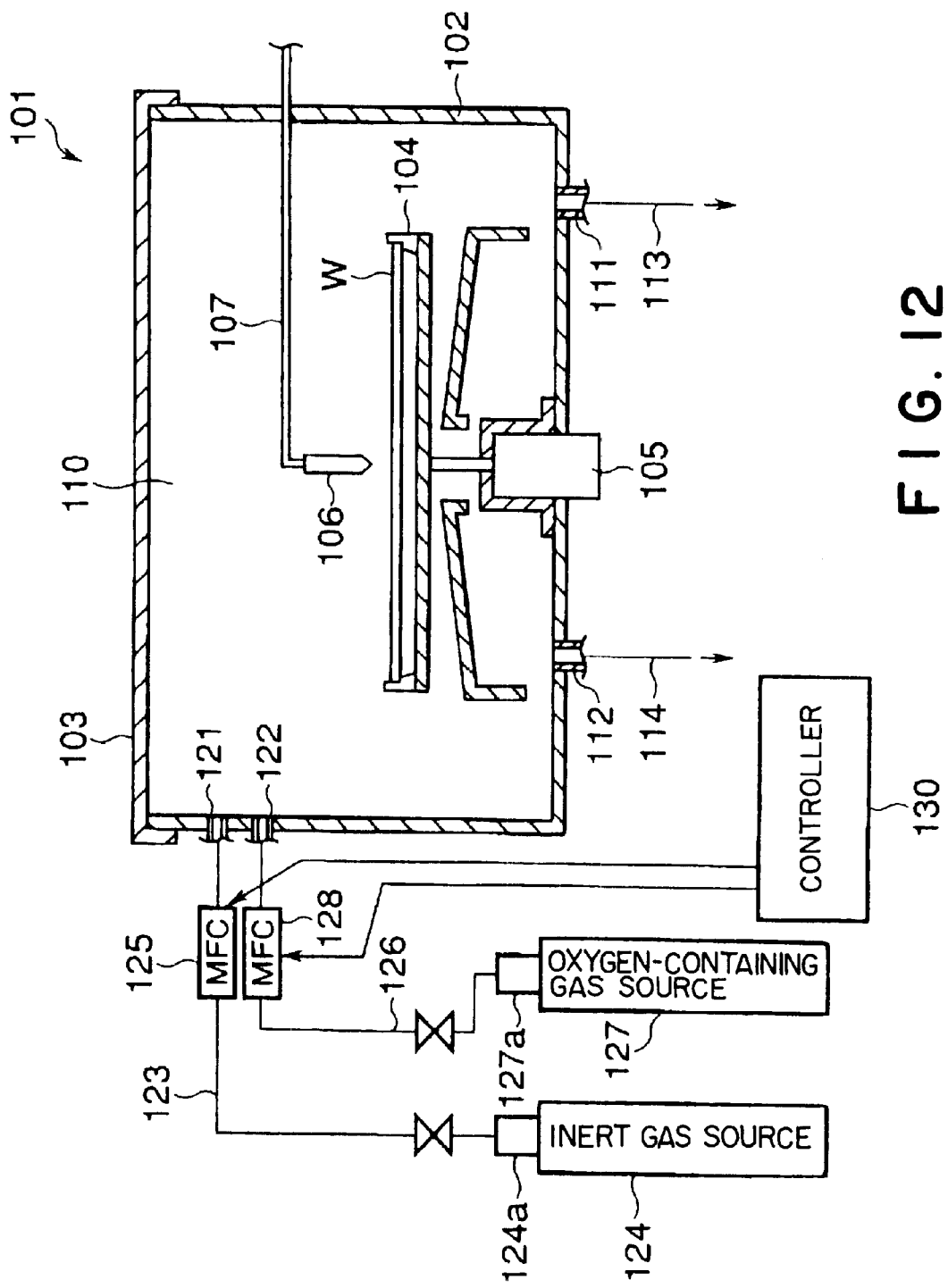
FIG. 12 is a schematic sectional view of a substrate processing apparatus in a third embodiment according to the present invention.

A substrate processing apparatus 101 in a second embodiment according to the present invention shown in FIG. 12 is of a single-wafer processing type. The substrate processing apparatus 101 has a processing vessel 102 in which a wafer W to be processed is placed. The upper open end of the processing vessel 102 is hermetically covered with a removable lid 103.

A spin chuck 104 is disposed in the processing vessel 102. The spin chuck 104 supports and holds the wafer W by its peripheral portion in a horizontal position. The spin chuck 104 is driven for rotation by a motor 105.

A discharge nozzle 106 is disposed in a vertical position above the wafer W placed in a processing space 110 defined by the processing vessel 102. A desired one of chemical liquids, pure water, IPA and an inert gas, such as $N_2$ gas, is supplied from a source through a pipe 107 to the discharge nozzle 106.

A drain port 111 for draining a used chemical liquid, used pure water and used IPA, and an exhaust port 112 for discharging the atmosphere in the processing space 110 are formed in the bottom wall of the processing vessel 102. A drain pipe 113 and an exhaust pipe 114 are connected to the drain port 111 and the exhaust port 112, respectively.

An inert gas supply port 121 through which an inert gas, such as $N_2$ gas or Ar gas, is supplied into the processing space 110 and an oxygen-containing gas supply port 122 through which an oxygen-containing gas, such as $O_2$ gas, air or ozone gas ($O_3$ gas), is supplied into the processing space 110 are formed in the side wall of the processing vessel 102. A pipe 123 is connected to the inert gas supply port 121. An inert gas is supplied from an inert gas source 124 through the pipe 123 into the processing space 110. A pipe 126 s connected to the oxygen-containing gas supply port 122. An oxygen-containing gas is supplied from an oxygen-containing gas source 127 through the pipe 126 into the processing space 110.

Heaters 124a and 12a are combined with the inert gas source 124 and the oxygen-containing gas source 127 to heat the inert gas and the oxygen-containing gas, respectively. The dissolving effect of the chemical liquid can be enhanced by raising the temperature of the atmosphere in the processing space 110 by the heated inert gas or the heated oxygen-containing gas supplied into the processing space 110. Mass-flow controllers 125 and 128 are placed in the inert gas supply pipe 123 and the oxygen-containing gas supply pipe 126 to control the respective flow rates of the inert gas and the oxygen-containing gas, respectively. Thus, the condition of the atmosphere in the processing space 110 can be regulated. The mass-flow controllers 125 and 128 are controlled by a controller 130. Flowmeters may be used instead of the mass-flow controllers and the respective flow rates of the gases flowing through the corresponding pipes may be manually adjusted.

The substrate processing apparatus 101 processes a wafer W in a sate shown in FIG. 8(d) by the following procedure. The lid 103 is opened and the wafer W is carried onto the spin chuck 104 by a carrying device, not shown, and the wafer W is held by suction on the spin chuck 104. The carrying device is moved away from the processing vessel 102, the lid 103 is put on the processing vessel 102 to form the sealed processing space 110.

The same procedure as that explained in connection with the first embodiment is executed. An inert gas is supplied through the inert gas supply port 121 into the processing space 110, the atmosphere in the processing space 110 is discharged through the exhaust port 112 to create an inert gas atmosphere substantially not containing oxygen.

Subsequently, the spin chuck 104 is driven for rotation, a predetermined chemical liquid (processing liquid) is discharged through the discharge nozzle 106 to remove a resist mask and polymer veils formed on the wafer W. If the used chemical liquid stays on the surface of the wafer W, the supply of the chemical liquid is stopped temporarily, a hot inert gas is discharged through the discharge nozzle 106 for several seconds and the spin chuck 104 is rotated at an increased rotating speed to remove the used chemical liquid from the surface of the wafer W. Thus, a chemical liquid discharging step and a used chemical liquid removing step are repeated alternately a plurality of times in the range of several times to several thousands times to remove the resist mask and the polymer veils.

After the resist mask and the polymer veils have been removed, an oxygen-containing gas is supplied through the oxygen-containing gas supply port 122 into the processing space 110 while the inert gas is supplied continuously from the inert gas source 124 to create an atmosphere having a small oxygen concentration in the processing space 110. Then, the spin chuck 104 is rotated and a chemical liquid is discharged through the discharge nozzle 106 to dissolve and remove CuO particles produced by oxidizing the Cu particles with oxygen contained in the atmosphere. If the used chemical liquid stays on the surface of the wafer W, the supply of the chemical liquid is stopped temporarily, a hot inert gas is discharged through the discharge nozzle 106 for several seconds and the spin chuck 104 is rotated at an increased rotating speed to remove the used chemical liquid from the surface of the wafer W. Then, the rotating speed of the spin chuck 104 is reduced to the normal rotating speed and the new chemical liquid is discharged through the discharge nozzle 106. Thus, a chemical liquid discharging step and a used chemical liquid removing step are repeated alternately a plurality of times in the range of several times to several thousands times to remove the resist mask and the polymer veils.

After the Cu particles 77 have been removed, the supply of the oxygen-containing gas is stopped and an inert gas atmosphere substantially not containing oxygen is created in the processing space 110, and the chemical liquid discharging step and the used chemical liquid removing step, which are similar to those steps for removing the resist mask and the polymer veils, are repeated alternately to remove the residual polymer layers.

After the resist mask, the polymer veils and the Cu particles have been removed, IPA or pure water is discharged through the discharge nozzle 106 to wash off residual reaction products from the wafer W. Subsequently, pure water is discharged through the discharge nozzle 106 to rinse the wafer W, and then the spin chuck 104 holding the wafer W is rotated at a high rotating speed for the spin-drying of the wafer W.

The modifications (1) to (5) of the first embodiment are applicable to carrying out the substrate processing method by the substrate processing apparatus of a single-wafer processing type.

The substrate processing apparatus 101 shown in FIG. 12 is applicable to processing the wafer shown in FIG. 10 which has undergone a Cu plating process and having the plated surface coated with a Cu film 81 and the back surface on which Cu deposits 82 are deposited. When processing the wafer W shown in FIG. 10, the wafer W is held on the spin chuck 104 with its back surface facing up, an inert gas atmosphere containing oxygen in a small oxygen concentration is created in the processing space 110, a chemical liquid is discharged through the discharge nozzle 106 onto the back surface of the wafer W and the foregoing processing steps are carried out to remove the Cu deposits 82 without damaging the plated Cu film 81.

In view of preventing damaging the Cu film 81, it is preferable to expose only the back surface of the wafer W on which the Cu film 81 is plated to the inert gas atmosphere having a small oxygen concentration by properly disposing a partition wall or the like in the processing space 110. Since a space under the spin chuck 104 is available for disposing the discharge nozzle 106, the Cu deposits 82 can be removed from the back surface of the wafer W without damaging the plated Cu film 81 by holding the wafer W on the spin chuck 104 with its back surface facing down.

The substrate processing method according to the present invention is applicable not only to removing the Cu particles but also to removing any metal particles (contamination) deposited on the wafer, provided that an oxide obtained by oxidizing the metal is dissolvable in a chemical liquid. Such a metal is, for example, Ru or Pt.

Although the foregoing embodiments supplies oxygen into the processing space by adding an oxygen-containing gas to the inert gas atmosphere, an oxygen-containing processing liquid prepared by dissolving oxygen in a chemical liquid may be used. When oxygen is dissolved in the chemical liquid in a proper oxygen concentration, the least necessary oxygen capable of oxidizing and removing the metal particles or contamination can be supplied, so that the metal particles or contamination can be removed limiting the oxidation of the metal layer to the least extent.

The substrate processing method according to the present invention is applicable to removing polymer veils after removing a resist mask by dry ashing and applicable also to processing other substrates including those for forming liquid crystal displays (LCDs).

What is claimed is:

1. A method of removing polymer veil and metal contamination deposited on a substrate having a metal layer with a processing liquid, said method comprising the steps of:

placing the substrate in a processing space;

creating an inert gas atmosphere in the processing space and supplying the processing liquid onto the substrate, thereby dissolving and removing the polymer veil; and creating an atmosphere of the inert gas and oxygen in the processing space and supplying a processing liquid onto the substrate, thereby dissolving and removing the metal contamination oxidized by the oxygen.

2. The method according to claim 1, wherein the step of dissolving and removing the metal contamination is carried out after the step of dissolving and removing the polymer veil.

3. The method according to claim 1, wherein the step of dissolving and removing the polymer veil and the step of dissolving and removing metal contamination are carried out alternately such that at least either the step of dissolving and removing the polymer veil or the step of dissolving and removing the metal contamination is repeated a plurality of times.

4. A method of removing a polymer veil remaining on a substrate after forming at least a metal layer on the substrate and an insulating layer over the metal layer and an etching portion of the insulating layer through the insulating layer so as to reach to the metal layer, and a metal contamination included in the polymer veil when the metal layer is sputtered by etching, said method comprising the steps of:

(a) placing the etched substrate in a processing space;

(b) creating an inert gas atmosphere in the processing space and supplying a processing liquid onto the substrate, thereby dissolving and removing the polymer veil to expose the metal contamination, (c) creating an atmosphere containing an inert gas and oxygen in the processing space and supplying the processing liquid onto the substrate after the step (b), thereby dissolving and removing the exposed metal contamination oxidized by the oxygen; and (d) creating an inert gas atmosphere again in the processing space, and supplying the processing liquid onto the substrate after the step (c), thereby dissolving and removing a residual of the polymer veil remaining on the substrate.

5. A method of removing a resist mask, a polymer veil and a metal contamination existing on a substrate, the substrate having a metal layer and an insulating layer arranged on the metal layer, the insulating layer being etched while using the resist mask so that the etched portion thereof reaches to the metal layer, the resist mask, the polymer veil and a metal contamination remaining on the substrate after the insulating layer being etched, the metal contamination being included in the polymer veil, said method comprising the steps of:

(a) placing the etched substrate in a processing space;

(b) supplying an inert gas into the processing space to create an inert gas atmosphere in the processing space and supplying a processing liquid onto the substrate, thereby dissolving and removing the resist mask;

(c) supplying a processing liquid onto the substrate placed in the processing space of the inert gas atmosphere, thereby dissolving and removing the polymer so that the metal contamination included in the polymer veil is exposed;

(d) introducing an oxygen-containing gas into the processing space after the step (b) and (c) to create an atmosphere containing oxygen in the processing space and supplying a processing liquid onto the substrate, thereby dissolving and removing the metal contamination oxidized by the oxygen; and (e) stopping introducing the oxygen-containing gas to create an inert gas atmosphere again in the processing space and supplying a processing liquid onto the substrate after the step (d), thereby dissolving and removing a residual of the polymer veil.

6. The method according to claim 5, wherein the step (b) and the step (c) are carried out simultaneously.

7. The method according to claim 5, wherein the step (d) and the step (e) are carried out alternately such that at least either the step (d) or the step (e) is repeated a plurality of times.

8. The method according to claim 5, wherein the step (c) includes the steps of:

(i) supplying the processing liquid onto the substrate; and (ii) removing the processing liquid from the substrate, wherein the step (i) and the step (ii) are carried out repeatedly and alternately.

9. The method according to claim 5, wherein the step (b) includes the steps of:
  (i) supplying the processing liquid onto the substrate; and
  (ii) removing the processing liquid from the substrate,
    wherein the step (i) and the step (ii) are carried out repeatedly and alternately.

10. The method according to claim 5, wherein the metal contamination is formed of at least one metal selected from the group consisting of Cu, Ru, and Pt.

11. The method according to claim 5, wherein the step (d) includes the steps of:
  (i) supplying the processing liquid onto the substrate; and
  (ii) removing the processing liquid from the substrate,
    wherein the step (i) and the step (ii) are carried out repeatedly and alternately.

* * * * *